(12) United States Patent
Saturley et al.

(10) Patent No.: US 11,013,146 B2
(45) Date of Patent: May 18, 2021

(54) ASYMMETRIC HEAT PIPE COUPLED TO A HEAT SINK

(71) Applicant: Ciena Corporation, Hanover, MD (US)

(72) Inventors: Peter Saturley, Ottawa (CA); Bonnie Mack, Carp (CA); Trevor Meunier, Kemptville (CA); Christian Pouliot, L'Ancienne-Lorette (CA)

(73) Assignee: Ciena Corporation, Hanover, MD (US)

( * ) Notice: Subject to any disclaimer, the term of this patent is extended or adjusted under 35 U.S.C. 154(b) by 298 days.

(21) Appl. No.: 15/906,431

(22) Filed: Feb. 27, 2018

(65) Prior Publication Data

US 2019/0269035 A1 Aug. 29, 2019

(51) Int. Cl.
| | |
|---|---|
| *F28F 7/00* | (2006.01) |
| *H05K 7/20* | (2006.01) |
| *B23P 15/26* | (2006.01) |
| *H05K 1/02* | (2006.01) |
| *G06F 1/20* | (2006.01) |
| *H01L 23/367* | (2006.01) |
| *F28D 15/00* | (2006.01) |
| *H01L 23/427* | (2006.01) |

(52) U.S. Cl.
CPC .......... *H05K 7/20336* (2013.01); *B23P 15/26* (2013.01); *F28D 15/00* (2013.01); *G06F 1/20* (2013.01); *H01L 23/3672* (2013.01); *H05K 1/0203* (2013.01); *B23P 2700/09* (2013.01); *H01L 23/427* (2013.01); *H05K 2201/064* (2013.01); *H05K 2201/066* (2013.01)

(58) Field of Classification Search
CPC ............. H05K 7/20336; H05K 1/0203; H05K 2201/064; H05K 2201/066; B23P 15/26; B23P 2700/09; H01L 23/427
See application file for complete search history.

(56) References Cited

U.S. PATENT DOCUMENTS

| | | | |
|---|---|---|---|
| 6,948,968 B1 | 9/2005 | Shearman et al. | |
| 7,224,582 B1 | 5/2007 | Saturley et al. | |
| 7,405,931 B2 | 7/2008 | Saturley et al. | |
| 8,286,693 B2 * | 10/2012 | Whitney | B21D 53/02 165/104.21 |
| 2008/0055855 A1 * | 3/2008 | Kamath | H01L 23/427 361/700 |
| 2009/0151898 A1 * | 6/2009 | Lai | F28D 15/0233 165/80.3 |

(Continued)

*Primary Examiner* — Claire E Rojohn, III
(74) *Attorney, Agent, or Firm* — Clements Bernard Walker; Lawrence A. Baratta, Jr.; Christopher L. Bernard (57) ABSTRACT

A method of installing an asymmetric heat pipe in a heat sink includes providing an asymmetric heat pipe with additional material on one side; forming a cavity in a base of the heat sink leaving additional base material on the component side of the heat sink; inserting the asymmetric heat pipe in the cavity; and removing the additional material on the asymmetric heat pipe and the additional base material on the heat sink to form a smooth and substantially uniform contact surface on the component side. An apparatus includes a component; a heat sink with a cavity; and a flattened heat pipe inserted into the cavity; wherein the heat sink and the heat pipe have a smooth and substantially uniform surface on the side proximal to the component and the heat pipe has a thickness which is substantially the same size on a component side and an opposite side.

9 Claims, 5 Drawing Sheets

(56) References Cited

U.S. PATENT DOCUMENTS

| | | | |
|---|---|---|---|
| 2009/0321054 A1* | 12/2009 | Qin | .................. H01L 23/427 |
| | | | 165/104.26 |
| 2015/0013936 A1 | 1/2015 | Mack | |
| 2015/0023388 A1 | 8/2015 | Saturley et al. | |
| 2016/0298652 A1 | 10/2016 | Saturley et al. | |
| 2017/0151641 A1* | 6/2017 | Lin | .................. B23P 15/26 |

* cited by examiner

ASYMMETRIC HEAT PIPE COUPLED TO A HEAT SINK

FIELD OF THE DISCLOSURE

The present disclosure generally relates to heat sinks and heat pipes for cooling high powered electrical and/or optical components. More particularly, the present disclosure relates to an asymmetric heat pipe coupled to a heat sink and associated method of installing.

BACKGROUND OF THE DISCLOSURE

Heat sinks are used to cool high power components in many different electronic assemblies, e.g., computers, networking equipment, optical modems, lasers, transceivers, switch circuitry, etc. Heat sinks rely on a flat contact surface with the component to ensure good thermal contact and efficient heat transmission. To improve heat sink performance, one or more heat pipes (with a higher thermal conductivity than solid materials) may be added to the system. Heat pipes may be used to improve the conduction of heat within the base of a single heat sink or to bring the heat out to a secondary device where it is dissipated. A heat pipe is a heat-transfer device that combines the principles of both thermal conductivity and phase transition to effectively transfer heat between two solid interfaces. At the hot interface of a heat pipe, a liquid in contact with a thermally conductive solid surface turns into a vapor by absorbing heat from that surface. The vapor then travels along the heat pipe to the cold interface and condenses back into a liquid—releasing the latent heat. The liquid then returns to the hot interface through either capillary action, centrifugal force, or gravity, and the cycle repeats. Due to the very high heat transfer coefficients for boiling and condensation, heat pipes are highly effective thermal conductors.

Heat pipes began to be used in computer systems in the late 1990s when increased power requirements and subsequent increases in heat emission resulted in greater demands on cooling systems. They are now extensively used in many modern computer systems and networking systems, typically to move heat away from components to heat sinks where thermal energy may be dissipated into the environment.

Heat pipes may be installed from the fin side or the component side of the heat sink. Installation from the fin side typically requires the removal/replacement of fins, adding cost and reducing performance. Installation from the component side eliminates this drawback, but the formed surface of the heat pipe is difficult to align with the machined surface on the heat sink, again reducing performance due to poor thermal contact with the component. It is possible to use a heat pipe with a thicker wall than is normally required. When combined with a base that is also thicker, the subsequent assembly may be machined down, removing any surface irregularities and creating a smooth, high performing contact surface with the component. However, this results in a base that is thicker than may be desirable and/or reduces the internal volume in the heat pipe. In the case where additional height is not available, shorter fins must be used, also reducing performance.

BRIEF SUMMARY OF THE DISCLOSURE

In an embodiment, a method of installing an asymmetric heat pipe in a heat sink include providing an asymmetric heat pipe with additional material on the component side; forming a cavity in a base of the heat sink leaving additional base material on a component side of the heat sink; inserting the asymmetric heat pipe in the cavity; and removing the additional material on the asymmetric heat pipe and the additional base material on the heat sink to form a smooth and substantially uniform contact surface on the component side. The method can further include flattening the asymmetric heat pipe prior to the inserting. The asymmetric heat pipe can include an orientation feature on the component side with the additional material. The can include machining the component side of the heat sink. The inserting can include brazing or soldering the asymmetric heat pipe in the cavity. The method can further include filling the asymmetric heat pipe with a wicking material and a working fluid and sealing each end of the asymmetric heat pipe. The method can further include inserting an opposite end of the asymmetric heat pipe from one inserted in the cavity into a second heat sink spaced apart from the heat sink. The method can further include installing the heat sink with the asymmetric heat pipe on a component which is adjacent to the component side of the heat sink with the asymmetric heat pipe. Subsequent to the removing, a thickness of the asymmetric heat pipe is substantially the same on a component side and an opposite side.

In another embodiment, a heat sink with a heat pipe located a component side of the heat sink is prepared by a process including the steps of: providing an asymmetric heat pipe with additional material on one side; forming a cavity in a base on the heat sink leaving additional base material on the component side of the heat sink; inserting the asymmetric heat pipe in the cavity; and removing the additional material on the flattened asymmetric heat pipe and the additional base material on the heat sink to form a machined contact surface on the component side. The heat sink prepared by the process can further include the step of flattening the asymmetric heat pipe prior to the inserting. The removing can include machining the component side of the heat sink. The inserting can include brazing or soldering the asymmetric heat pipe in the cavity. The asymmetric heat pipe can be filled with a wicking material and a working fluid and each end of the asymmetric heat pipe can be sealed.

In a further embodiment, an apparatus includes a component; a heat sink with a cavity; and a flattened heat pipe inserted into the cavity; wherein the heat sink and the flattened heat pipe have a smooth and substantially uniform surface on the side proximal to the component and the flattened heat pipe has a thickness which is substantially the same size on a component side and an opposite side. The flattened heat pipe can be flattened prior to insertion into the cavity with additional material on the component side of the flattened heat pipe. The flattened heat pipe can include an orientation feature on the component side with the additional material. The additional material can be removed along with additional base material on the heat sink via machining the component side of the heat sink to form the smooth and substantially uniform surface. The flattened heat pipe can be brazed or soldered after insertion in the cavity. The flattened heat pipe can be filled with a wicking material and a working fluid and each end of the flattened heat pipe is sealed.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

The present disclosure relates to an asymmetric heat pipe coupled to a heat sink and associated method. The combination of the asymmetric heat pipe and the heat sink is used to cool an electronic component, such as on a Printed Circuit Board (PCB). To maximize performance with the heat pipe, the heat sink, and the component, a flat, uniform contact surface is required, as well as the highest possible heat sink fins that will fit in the system. To reduce the height required to accommodate the heat pipe, it is proposed that the initial extrusion used to make the heat pipe be asymmetric, resulting in favorable positioning of additional material that may be removed by machining to produce a flat, uniform, smooth contact surface.

As described herein, the heat pipe is asymmetric because it contains additional material on one side that is machined off after the asymmetric heat pipe is placed in a cavity in the heat sink. The additional material is removed (e.g., machined off) with additional base material from the heat sink. The result is an extremely smooth contact surface on the component side of the heat sink, i.e., the component side is where the heat sink and the asymmetric heat pipe make thermal contact with a component. Also, the result is the heat pipe has approximately the same thickness on a component side and an opposite side relative to the component side after the additional material is machined off.

Those skilled in the art recognize thermal management is a significant design challenge as components become faster, have higher power dissipation, etc. Also, with the design requirements of smaller form factors, there is a need to obtain as much thermal management performance as possible. The asymmetric heat pipe and the smooth contact surface enable additional fin height and superior thermal coupling between the heat sink and the component. That is, the smooth contact surface has no gaps or irregularities because the additional material from the asymmetric heat pipe and the additional base material form the heat sink are removed at the same step.

The additional material also enables the asymmetric heat pipe to maximize its internal diameter. Those skilled in the art recognize the thermal performance of a heat sink and heat pipe are generally based on the area of the fins on the heat sink, the area inside the heat pipe, and the thermal conductivity between a component and the heat sink and heat pipe. The present disclosure addresses each.

Figure 1:
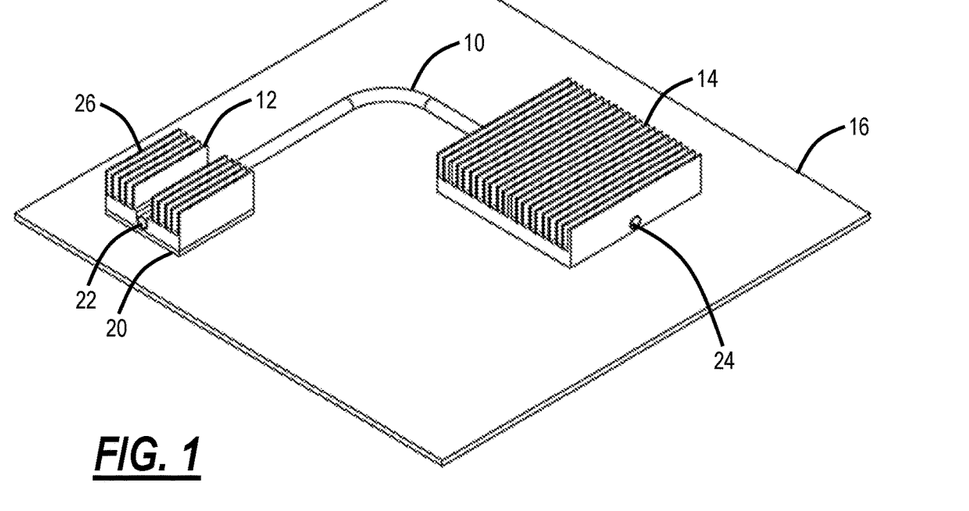
FIG. 1 is a perspective view of a conventional heat pipe between a first heat sink and a second heat sink on a Printed Circuit Board (PCB)
Figure 2:
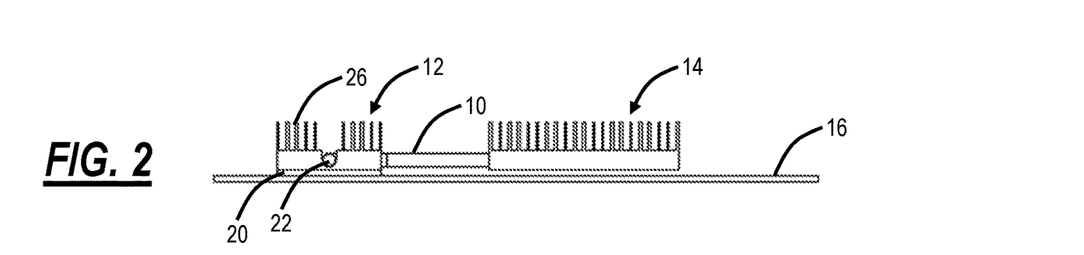
FIG. 2 is a side view of the conventional heat pipe of FIG. 1 between the first heat sink and the second heat sink on the PCB.
Figure 3:
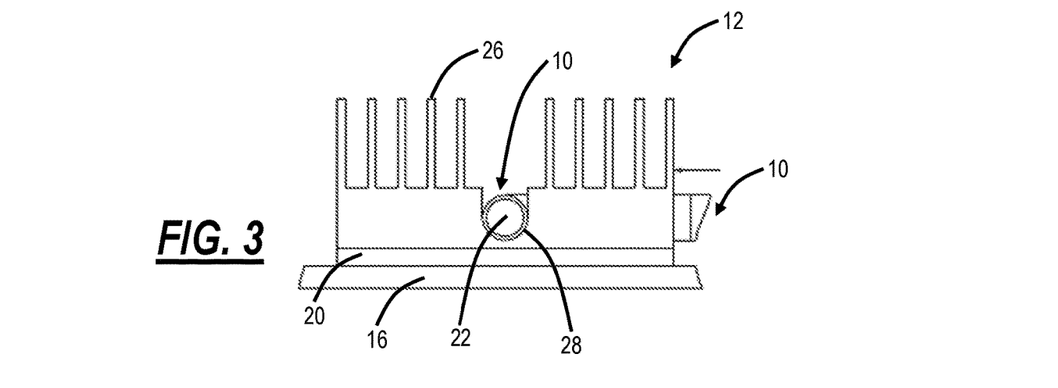
FIG. 3 is a close-up side view of the conventional heat pipe of FIG. 1 connected to the first heat sink.

FIG. 1 is a perspective view of a conventional heat pipe 10 between a first heat sink 12 and a second heat sink 14 on a Printed Circuit Board (PCB) 16. FIG. 2 is a side view of the conventional heat pipe 10 between the first heat sink 12 and the second heat sink 14 on the PCB 16. FIG. 3 is a close-up side view of the conventional heat pipe 10 connected to the first heat sink 12.

The heat pipe 10 is configured to transfer heat from the first heat sink 12 to the second heat sink 14. The first heat sink 12 can be adjacent to a component 20 on the PCB 16. For example, the component 20 can be a microprocessor; a Central Processing Units (CPU); a Digital Signal Processor (DSP): a customized processor such as a Network Processor (NP) or a Network Processing Unit (NPU), a Graphics Processing Unit (GPU), or the like; a Field Programmable Gate Arrays (FPGA); an Application Specific Integrated Circuit (ASIC), or any component which generates heat.

The heat pipe 10 is typically manufactured from extruded copper pipe, which is radially symmetric. These extrusions are filled with a wicking material and a working fluid and sealed at ends 22, 24. The first heat sink 12 includes fins 26 which assist in the thermal conductivity of the first heat sink 12. Also, the second heat sink 14 also includes fins. The surface area, height, distance between adjacent fins, etc. of the fins 26 all contribute to thermal conductivity efficiency of the first heat sink 12. Further, as space is often a design constraint, fin height is limited, such as in mobile devices, etc.

In FIGS. 1, 2, and 3, the heat pipe 10 is installed from the fin side of the first heat sink 12. As shown in FIGS. 1, 2, and 3, installation of the heat pipe 10 from the fin side requires the removal/replacement of fins 26, adding cost and reducing performance. Specifically, the first heat sink 12 must have some of the fins 26 removed and a surface 28 of the first heat sink 12 is machined for contact with the heat pipe 10.

Figure 4:
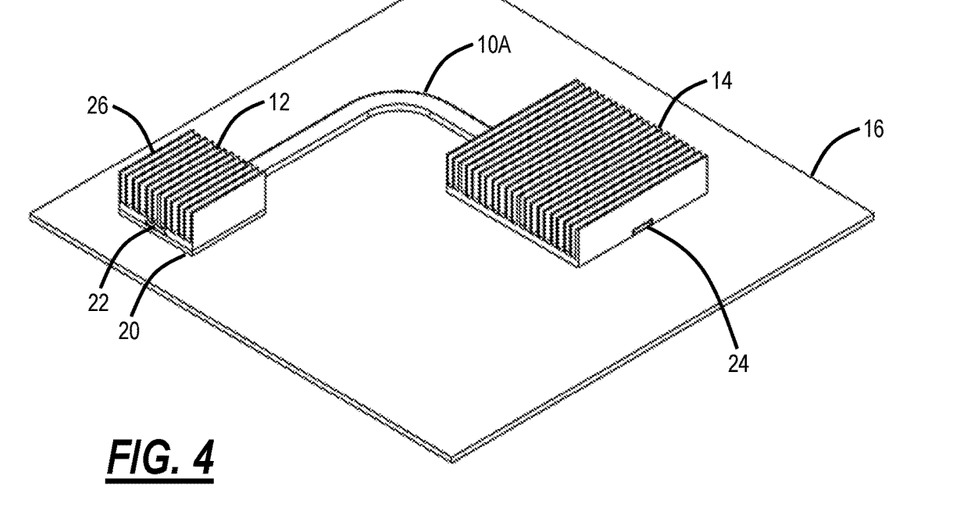
FIG. 4 is a perspective view of a flattened heat pipe between the first heat sink and the second heat sink on the PCB.
Figure 5:
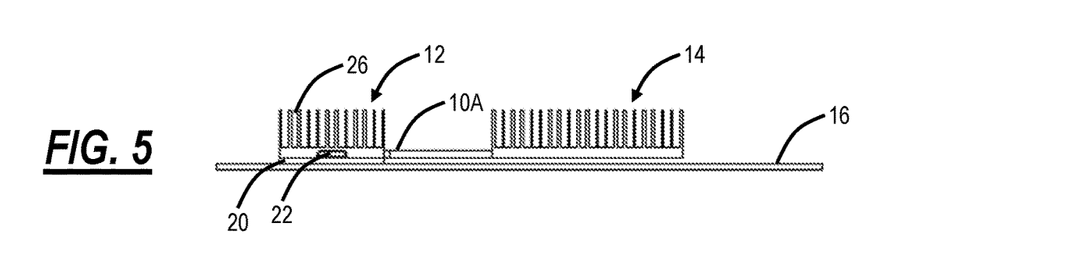
FIG. 5 is a side view of the flattened heat pipe of FIG. 4 between the first heat sink and the second heat sink on the PCB.
Figure 6:
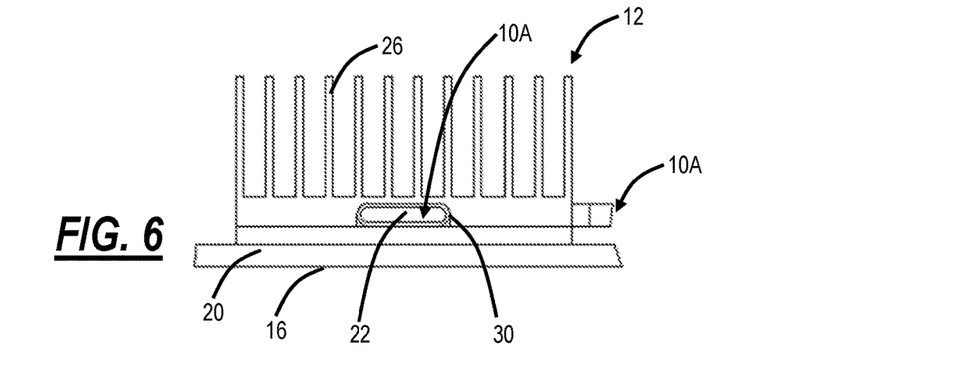
FIG. 6 is a close-up side view of the flattened heat pipe of FIG. 4 connected to the first heat sink.

FIG. 4 is a perspective view of a flattened heat pipe 10A between the first heat sink 12 and the second heat sink 14 on the Printed Circuit Board (PCB) 16. FIG. 5 is a side view of the flattened heat pipe 10A between the first heat sink 12 and the second heat sink 14 on the PCB 16. FIG. 6 is a close-up side view of the flattened heat pipe 10A connected to the first heat sink 12.

In FIGS. 4, 5, and 6, the flattened heat pipe 10A is installed in the first heat sink 12 from the component 20 side to eliminate the drawback from FIGS. 1, 2, and 3 where the fins 26 were removed to support the heat pipe 10. However, this approach with the flattened heat pipe 10A has the disadvantage that a formed surface on the flattened heat pipe 10A is difficult to align with a machined surface 30 on the first heat sink 12, again reducing performance.

Figure 7:
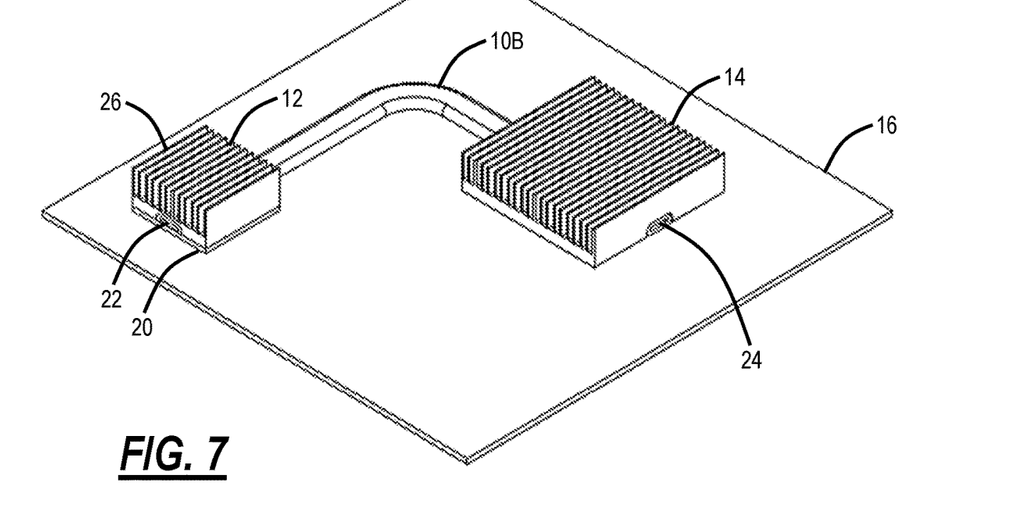
FIG. 7 is a perspective view of a flattened heat pipe with a thicker wall between the first heat sink and the second heat sink on the Printed Circuit Board (PCB)
Figure 8:
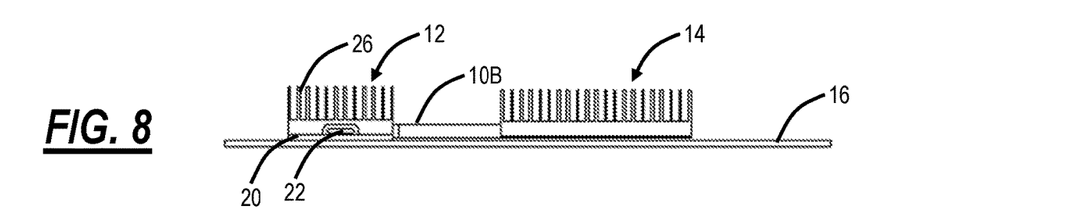
FIG. 8 is a side view of the flattened heat pipe of FIG. 7 with the thicker wall between the first heat sink and the second heat sink on the PCB.
Figure 9:
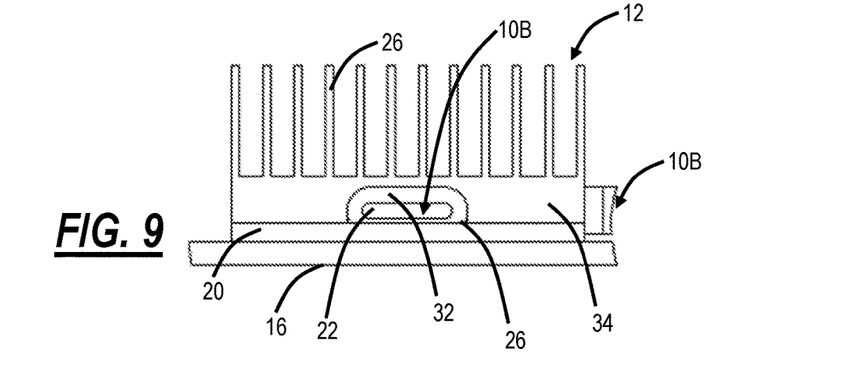
FIG. 9 is a close-up side view of the flattened heat pipe of FIG. 7 with a thicker wall connected to the first heat sink

FIG. 7 is a perspective view of a flattened heat pipe 10B with a thicker wall between the first heat sink 12 and the second heat sink 14 on the Printed Circuit Board (PCB) 16. FIG. 8 is a side view of the flattened heat pipe 10B with the thicker wall between the first heat sink 12 and the second heat sink 14 on the PCB 16. FIG. 9 is a close-up side view of the flattened heat pipe 10B with a thicker wall connected to the first heat sink 12.

To address the alignment of the flattened heat pipe 10A with the machined surface 30, the flattened heat pipe 10B can have a thicker wall then is normally required, i.e., walls 32 of the flattened heat pipe 10B are thicker than the walls of the flattened heat pipe 10A. When combined with a base 34 of the first heat sink 12 that is also thicker, the subsequent assembly may be machined down, removing any surface irregularities and creating a smooth, high performing contact surface 36 between the flattened heat pipe 10B, the first heat sink 12, and the component 20. However, this results in a base 34 that is thicker than may be desirable and reduced interior area of the flattened heat pipe 10B. In the case where additional height is not available, shorter fins 36 must be used, also reducing performance.

Note, the flattened heat pipes 10A, 10B can also be circular, i.e., not flattened. These heat pipes 10A, 10B are flattened to reduce the height of the base 34, then the heat pipe 10A, 10B is brazed or soldered into a matching cavity in the first heat sink 12.

Figure 10:
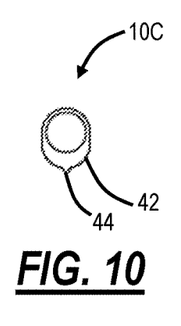
FIG. 10 is a side view of an end of the asymmetric heat pipe as an extruded heat pipe with additional material.
Figure 11:
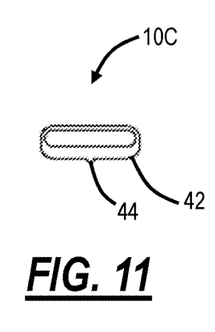
FIG. 11 is a side view of the end of the asymmetric heat pipe which is flattened from FIG. 10.
Figure 12:
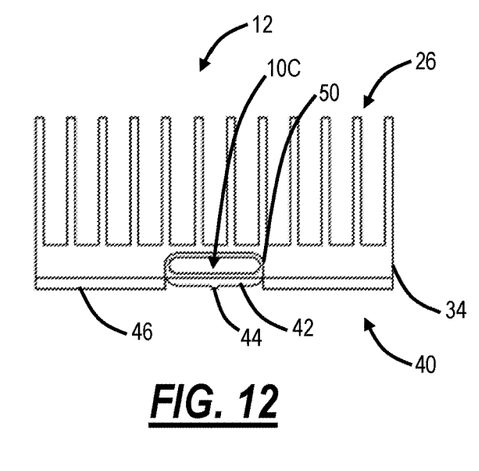
FIG. 12 is a side view of the asymmetric heat pipe inserted in a cavity of the first heat sink with additional material on both the base of the first heat sink and the asymmetric heat pipe.
Figure 13:
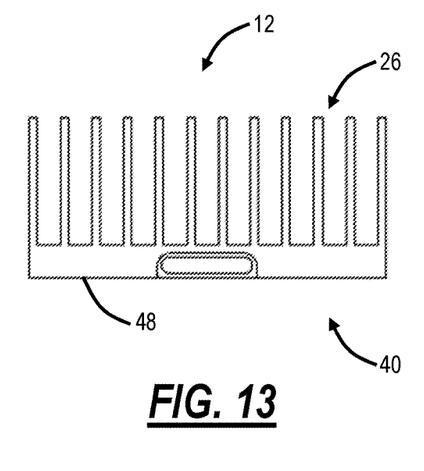
FIG. 13 is a side view of the asymmetric heat pipe inserted in the cavity of the first heat sink with the additional material machined off to form a completed heat sink and heat pipe.

FIGS. 10-13 are side views of an asymmetric heat pipe 10C and associated steps for coupling to a first heat sink 12. Specifically, FIG. 10 is a side view of an end of the asymmetric heat pipe 10C as an extruded heat pipe with additional material. FIG. 11 is a side view of the end of the asymmetric heat pipe 10C which is flattened from FIG. 10. FIG. 12 is a side view of the asymmetric heat pipe 10C inserted in a cavity of the first heat sink 12 with additional material on both the base 34 of the first heat sink 12 and the asymmetric heat pipe 10C. FIG. 13 is a side view of the asymmetric heat pipe 10C inserted in the cavity of the first heat sink 12 with the additional material machined off to form a completed heat sink and heat pipe.

The combination of the asymmetric heat pipe 10C and the first heat sink 12 is used to cool the component 20, such as on PCB 20. To maximize performance with the heat pipe 10C and the heat sink 12, a flat, uniform contact surface is required on a component side 40, as well as the highest possible heat sink fins 26 that will fit in the system. To reduce the height required to accommodate the heat pipe 10C, it is proposed that the initial extrusion used to make the heat pipe 10C be asymmetric, resulting in favorable positioning of additional material 42 that may be removed by machining to produce a flat, uniform, smooth contact surface 48.

In FIG. 10, a radially asymmetric extrusion profile is instead, with the additional material 42 to facilitate post-installation machining. To ease orientation during manufacture and assembly, an additional orientation feature 44 can be added to the profile on the side with the additional material 42. The orientation feature 44 can be a protrusion, indentation, a marking, or the like in the extrusion profile of the additional material 42. With the orientation feature 44 as an indentation, it could act as a depth gauge for the machining process on the bottom of the heat sink, e.g., once the indentation is fully machined away, the optimal heat pipe wall thickness has been achieved.

The initial copper extrusion used to create the heat pipe 10C is typically made from a circular profile, as in FIG. 10. By using an asymmetric profile, the heat pipe 10C is created that has the additional material 42 only on the side of the contact surface. This geometry can then be assembled into a base 34 of the heat sink 12 with additional base material 46, and the subsequent assembly machined down to create a smooth contact surface 48. No penalty for a thicker heat pipe wall is incurred (as in FIGS. 7, 8, and 9), allowing for maximum performance in minimal height.

Of note, thermal performance is a limiting case in many of high-performance devices. The power dissipation and operating temperature for many components are limited by the size (especially height) of the heat sink 12 that may be used in a given assembly. By providing a means of achieving higher performance without requiring additional height through the present disclosure, the component power dissipation and/or operating temperature may be increased. Of note, as illustrated in FIG. 13, the thickness of the heat pipe 50 is approximately a same size on all sides, while the component side is machined to remove the additional material 42 while also removing the additional base material 46.

The ability to create a smooth contact surface 48 between the heat pipe 10C, the heat sink 12, and the component 20 to be cooled would reduce the thermal contact resistance between the two parts, thereby reducing the operating temperature of the part to be cooled. The contact resistance could be reduced by a factor of 2 or more.

In an embodiment, an apparatus with an asymmetric heat pipe for use with a heat sink on a component side includes an asymmetric heat pipe 10C with additional material 42 on one side; and a heat sink 12 with a cavity 50 formed on a component side 40 leaving additional base material 46 on the component side 40 of the heat sink 12; wherein the asymmetric heat pipe 10C is inserted into the cavity 50 and the additional material 42 and the additional base material 46 are removed thereby leaving a smooth contact surface 48 on the component side 40.

The asymmetric heat pipe 10C can be flattened prior to insertion into the cavity 50 with the additional material 42 on a bottom on the flattened asymmetric heat pipe 10C. The asymmetric heat pipe 10C can include an orientation feature 44 on the one side with the additional material 42. The additional material and the additional base material can be removed via machining the component side of the heat sink. The asymmetric heat pipe can be brazed or soldered after insertion in the cavity. The asymmetric heat pipe is filled with a wicking material, and a working fluid and each end of the asymmetric heat pipe is sealed. An opposite end of the asymmetric heat pipe from one inserted in the cavity can be inserted into a second heat sink spaced apart from the heat sink.

Figure 14:
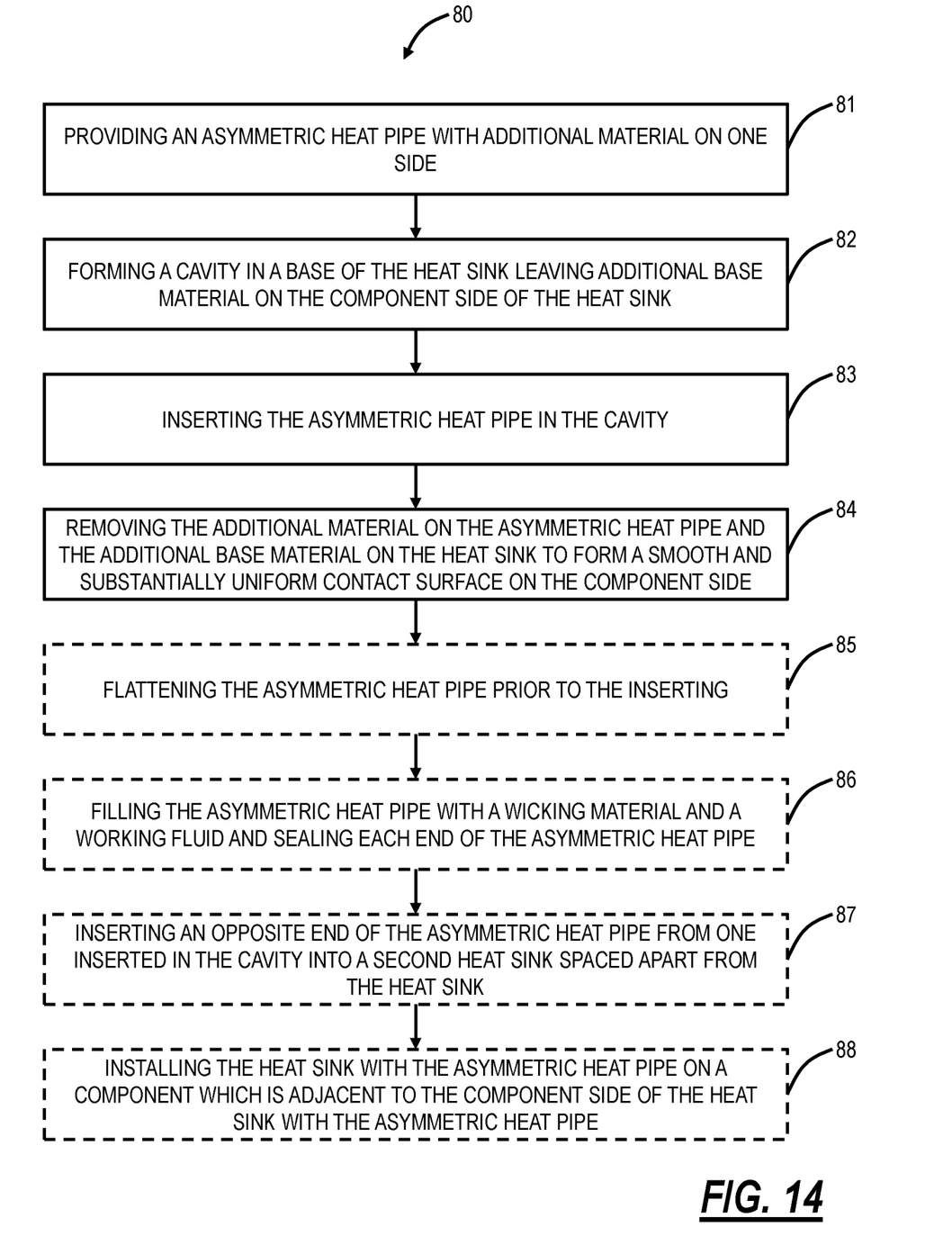
FIG. 14 is a flowchart of a process of installing an asymmetric heat pipe in a heat sink.

FIG. 14 is a flowchart of a process 80 of installing an asymmetric heat pipe in a heat sink. The process 80 includes providing an asymmetric heat pipe 10C with additional material 42 on one side (step 81); forming a cavity 50 in a base 30 of the heat sink 12 leaving additional base material 46 on the component side 40 of the heat sink 12 (step 82); inserting the asymmetric heat pipe 10C in the cavity 50 (step 83); and removing the additional material 42 on the asymmetric heat pipe 10C and the additional base material 46 on the heat sink 12 to form a smooth and substantially uniform contact surface 48 on the component side 40 (step 84).

The process 80 can further include flattening the asymmetric heat pipe 10C prior to the inserting (step 85). The process 80 can further include filling the asymmetric heat pipe 10C with a wicking material and a working fluid and sealing each end of the asymmetric heat pipe (step 86). The process 80 can further include inserting an opposite end of the asymmetric heat pipe 10C from one inserted in the cavity into a second heat sink 14 spaced apart from the heat sink 12 (step 87). The process 80 can further include installing the heat sink 12 with the asymmetric heat pipe 10C on a component 20 which is adjacent to the component side 40 of the heat sink 12 with the asymmetric heat pipe 10C (step 88). Note, while step 85 is shown after step 83, step 85 may be performed prior to step 83. Further, the order of steps 84, 85, 86, 87, 88 could be in any order and these steps could be optional, i.e., zero or more of these steps could be performed in any order.

The asymmetric heat pipe 10C can include an orientation feature 44 on the one side with the additional material 42. The removing can include machining the component side 40 of the heat sink 12. The inserting can include brazing or soldering the asymmetric heat pipe 10C in the cavity 50.

In another embodiment, a heat sink 12 with a heat pipe located a component side of the heat sink cane be prepared by a process including the steps of providing an asymmetric heat pipe with additional material on one side; flattening the asymmetric heat pipe with the additional material on one side; forming a cavity in a base on the heat sink leaving additional base material on the component side of the heat sink; inserting the flattened asymmetric heat pipe in the cavity; and removing the additional material on the flattened asymmetric heat pipe and the additional base material on the heat sink to form a machined contact surface on the component side.

The asymmetric heat pipe can include an orientation feature on the one side with the additional material. The removing can include machining the component side of the heat sink. The inserting can include brazing or soldering the asymmetric heat pipe in the cavity. The asymmetric heat pipe can be filled with a wicking material and a working fluid and each end of the asymmetric heat pipe is sealed.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method of installing an asymmetric heat pipe in a heat sink, the method comprising:
   providing an asymmetric heat pipe with additional material on one side;
   forming a cavity in a base of the heat sink leaving additional base material on a component side of the heat sink;
   inserting the asymmetric heat pipe in the cavity; and
   removing the additional material on the asymmetric heat pipe and the additional base material on the heat sink to form a smooth contact surface on the component side.

2. The method of claim 1, further comprising:
   flattening the asymmetric heat pipe prior to the inserting.

3. The method of claim 1, wherein the asymmetric heat pipe comprises an orientation feature on the component side with the additional material.

4. The method of claim 1, wherein the removing comprises machining the component side of the heat sink.

5. The method of claim 1, wherein the inserting comprises brazing or soldering the asymmetric heat pipe in the cavity.

6. The method of claim 1, further comprising:
   filling the asymmetric heat pipe with a wicking material and a working fluid and sealing each end of the asymmetric heat pipe.

7. The method of claim 1, further comprising:
   inserting an opposite end of the asymmetric heat pipe from one inserted in the cavity into a second heat sink spaced apart from the heat sink.

8. The method of claim 1, further comprising:
   installing the heat sink with the asymmetric heat pipe on a component which is adjacent to the component side of the heat sink with the asymmetric heat pipe.

9. The method of claim 1, wherein, subsequent to the removing, a thickness of the asymmetric heat pipe is the same on a component side and an opposite side.

\* \* \* \* \*